Figure 1:
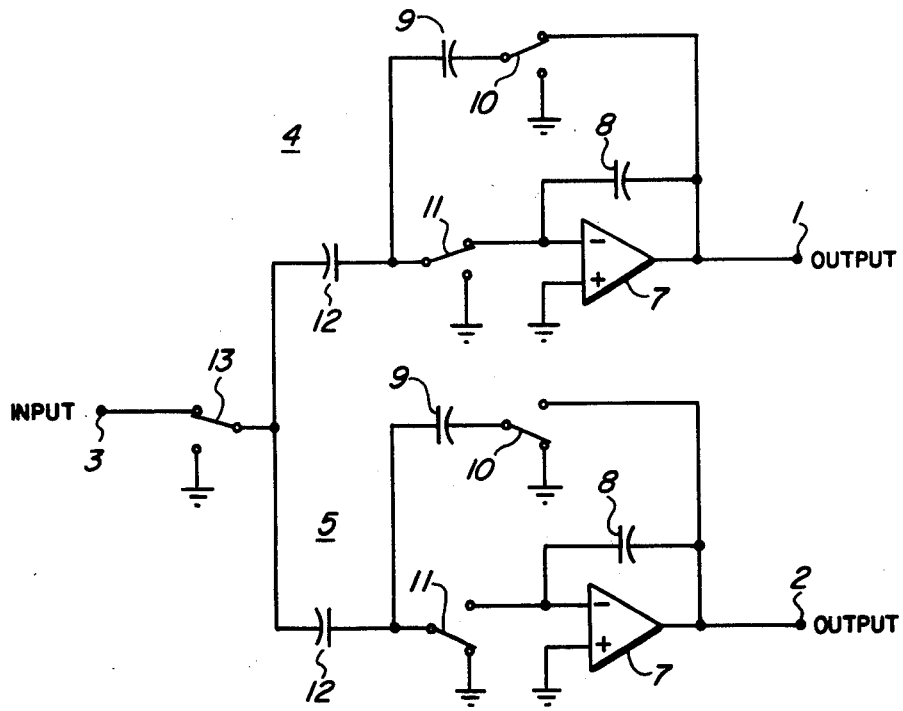

United States Patent [19]

Bennett

[11] 4,453,130
[45] Jun. 5, 1984

[54] SWITCHED-CAPACITOR STAGE WITH DIFFERENTIAL OUTPUT

[75] Inventor: Jeffrey H. Bennett, Ottawa, Canada

[73] Assignee: Northern Telecom Limited, Montreal, Canada

[21] Appl. No.: 411,414

[22] Filed: Aug. 25, 1982

[51] Int. Cl.³ .............................................. H03F 1/34
[52] U.S. Cl. .................................... 330/51; 330/107; 330/117; 330/301; 328/127; 307/490
[58] Field of Search ................ 307/490; 328/127, 128; 330/9, 51, 117, 275, 301, 107

[56] References Cited

U.S. PATENT DOCUMENTS 4,352,069 9/1982 Dessoulavy ................... 307/490 X

Primary Examiner—James B. Mullins
Assistant Examiner—Steven J. Mottola
Attorney, Agent, or Firm—R. John Haley

[57] ABSTRACT

A differential output is provided from a single-ended input by a switched-capacitor stage having a through-switched capacitor coupled via an amplifier to one output terminal and a diagonally-switched capacitor coupled via an amplifier to another output terminal. Each amplifier is provided with a through-switched negative feedback capacitor. A delay inherent in the switching of the diagonally-switched capacitor provides an interpolation effect in the differential output.

6 Claims, 2 Drawing Figures

SWITCHED-CAPACITOR STAGE WITH DIFFERENTIAL OUTPUT

This invention relates to a switched-capacitor stage for producing differential output signals from a single-ended input signal.

It is generally known to produce differential output signals from a single-ended input signal using two buffer amplifiers, one of which is inverting and the other non-inverting, or using two similar buffer amplifiers with an inverting amplifier connected from the input or output of one of them to the input of the other. These arrangements have the disadvantage of having different output characteristics for the different buffers and/or different signal delays through the different signal paths.

Accordingly, an object of this invention is to provide a new arrangement for producing differential output signals from a single-ended input signal using switched-capacitor techniques. Such an arrangement is particularly useful where preceding circuitry also uses switched-capacitor techniques, but the invention is not limited in this respect.

According to one aspect the invention provides a switched-capacitor stage having a single-ended input and a differential output, the stage comprising a first through-switched capacitor coupled between said input and a first differential output terminal, and a second diagonally-switched capacitor coupled between said input and a second differential output terminal.

Preferably the stage includes first and second amplifiers via which the first and second capacitors respectively are coupled to the first and second output terminals respectively, two unswitched capacitors each coupled between an output and an inverting input of a respective one of the amplifiers, and first and second through-switched negative feedback capacitors coupled to the first and second amplifiers respectively.

Expediently said first through-switched capacitor and the first through-switched negative feedback capacitor comprise common switching means coupled between said capacitors and the inverting input of the first amplifier, and said second diagonally-switched capacitor and the second through-switched negative feedback capacitor comprise common switching means coupled between said capacitors and the inverting input of the second amplifier.

The stage conveniently comprises switching means, which is common to said first through-switched capacitor and said second diagonally-switched capacitor, coupled between said input and each of said first and second capacitors.

According to another aspect the invention provides a switched-capacitor stage comprising first and second signal paths from a single-ended input to a respective one of two differential output terminals, each signal path comprising an amplifier having an inverting input and an output coupled to the respective output terminal, an unswitched capacitor coupled between the inverting input and the output of the amplifier, a feedback capacitor and first and second switching means for selectively and simultaneously connecting the terminals of the feedback capacitor either to the output and inverting input respectively of the amplifier or to a reference potential, a further capacitor having one terminal connected to the junction between the feedback capacitor and the second switching means, and third switching means for connecting the other terminal of the further capacitor selectively to either the input or the reference potential synchronously with the first and second switching means, the operations of the first and second switching means relative to those of the third switching means of the two signal paths being oppositely phased whereby the further capacitor of the first signal path is through-switched and the further capacitor of the second signal path is diagonally-switched to produce differential output signals from a single-ended input signal.

Thus the invention uses a through-switched capacitor and a diagonally-switched capacitor in respective signal paths to provide differential outputs from a single-ended input. As explained below, this arrangement also effects an interpolation of the differential output signal, which is advantageous.

Figure 2:
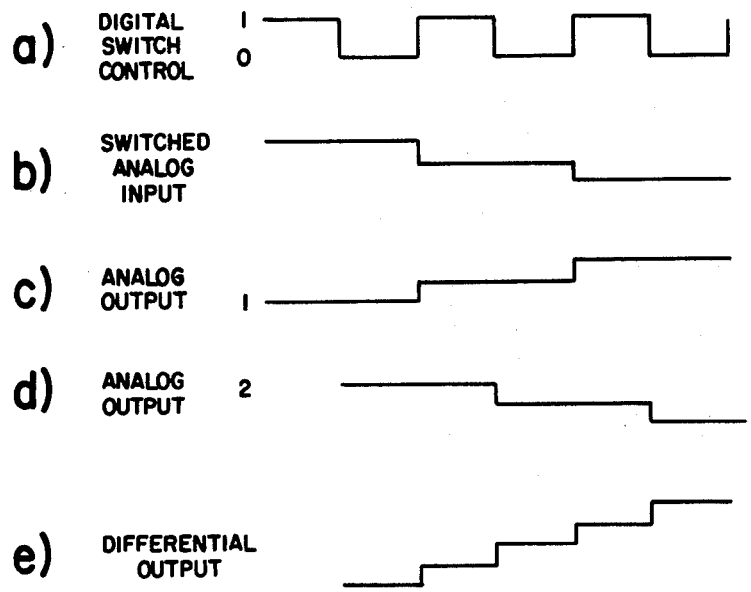

The invention will be further understood from the following description with reference to the accompanying drawings, in which:

FIG. 1 schematically illustrates a switched-capacitor stage according to a preferred embodiment of the invention; and FIG. 2 is a signal diagram illustrating the interpolating effect of the stage.

As used herein, the term "unswitched capacitor" means a capacitor that is permanently connected in the circuit; the term "through-switched capacitor" means a switched-capacitor whose two terminals are simultaneously grounded, or connected to a reference potential, during one of two switching states; and the term "diagonally-switched capacitor" means a switched-capacitor whose terminals are alternately grounded during successive ones of two switching states. In FIG. 1 the various switches of the switched capacitors are shown in one of their two switching states; all of the switches are operated in synchronism by means not shown. The switches are controlled and are implemented by CMOS devices as is well known in the art.

Referring to FIG. 1, the switched-capacitor stage produces differential output signals at output terminals 1 and 2 from a single-ended input signal at an input 3. To this end the stage provides two signal paths 4 and 5 from the input 3 to the output terminals 1 and 2 respectively. Except for the timing of the switch operations, the two signal paths are identical. Each signal path includes a differential amplifier 7, having an output connected to the respective output terminal 1 or 2, a non-inverting input connected to circuit ground, and an inverting input; an unswitched integrating capacitor 8 connected between the inverting input and the output of the amplifier; a through-switched negative feedback capacitor 9 connected via a switch 10 to the output of the amplifier and via a switch 11 to the inverting input of the amplifier; a further switched-capacitor 12 having one terminal connected to the junction between the capacitor 9 and the switch 11, and hence connected to the inverting input of the amplifier via the switch 11; and a further switch 13 connecting the other terminal of the capacitor 12 to the input 3. A single switch 13 serves commonly for the two signal paths 4 and 5, but separate switches could be provided if desired.

The switches 10, 11, and 13 are all operated in synchronism with one another, for example at a switching frequency of 125kHz for handling voice-frequency signals at frequencies up to 3.5kHz. As illustrated in FIG. 1, the switches 10 and 11 in the signal path 5 are operated with the opposite phase to the switch 13 and to the switches 10 and 11 in the signal path 4. In consequence, in the signal path 4 the capacitor 9 is through-switched via the switches 10 and 11 and the capacitor 12 is through-switched via the switches 13 and 11, whereas in the signal path 5 the capacitor 9 is through-switched via the switches 10 and 11 but the capacitor 12 is diagonally-switched via the switches 13 and 11.

As a result of the diagonal switching of the capacitor 12 in the signal path 5, and the phasing of the switches 10 and 11 in this signal path in relation to the switch 13, the input signal is applied to the inverting input of the amplifier 7 in the signal path 5 inverted and delayed by half of one period of the switching frequency. The inversion results in the production of the differential output signals at the output terminals 1 and 2. The delay is advantageous in providing an interpolation effect as described below with reference to FIG. 2

FIG. 2 illustrates signals which may occur during three cycles of a digital switch control waveform shown at FIG. 2(a), the switches 10, 11, and 13 in FIG. 1 being in the states shown in FIG. 1 when the digital switch control waveform is a logic 1 level. FIG. 2(b) shows a switched analog input signal which is assumed to be applied to the input 3 from preceding switched-capacitor circuitry. This input as shown in FIG. 2(b) is of decreasing magnitude, each magnitude level remaining constant for the duration of one period of the switch control waveform. The resultant switched analog outputs at the terminals 1 and 2 are shown in FIGS. 2(c) and 2(d) respectively, the output at the terminal 2 being inverted and delayed by half a period in relation to that at the terminal 1 due to the diagonally-switched capacitor 12 in the signal path 5, and the related switching state timing. The resultant differential output signal, shown in FIG. 2(e), has steps occurring at twice the switch control frequency at a relative magnitude only half that of the input and individual output signals. This interpolation effect, providing doubled step frequency and halved relative step magnitude, considerably facilitates filtering and smoothing of the differential output signal.

As will be appreciated by those skilled in the art, the switched-capacitor stage illustrated in FIG. 1 can be implemented, together with other switched-capacitor circuitry if desired, in a single integrated circuit, for example using a CMOS double polysilicon process. In such an arrangement each of the capacitors may, for example, have a nominal capacitance of 2pF, the bottom plate of each capacitor being represented by a curved line in FIG. 1. In order to facilitate use of such an arrangement in, for example, a telephone repeater for voice frequency channels, each output of the stage in FIG. 1 may be additionally provided with a power buffer stage and an output protection device of known form.

The invention is not limited to the particular embodiment described, and numerous modifications, variations, and adaptations may be made thereto without departing from the scope of the invention as defined in the claims.

What is claimed is:

1. A switched-capacitor stage having a single-ended input and a differential output, the stage comprising a first through-switched capacitor coupled between said input and a first differential output terminal, and a second diagonally-switched capacitor coupled between said input and a second differential output terminal.

2. A switched-capacitor stage as claimed in claim 1 and including first and second amplifiers via which the first and second capacitors respectively are coupled to the first and second output terminals respectively, two unswitched capacitors each coupled between an output and an inverting input of a respective one of the amplifiers, and first and second through-switched negative feedback capacitors coupled to the first and second amplifiers respectively.

3. A switched-capacitor stage as claimed in claim 2 wherein said first through-switched capacitor and the first through-switched negative feedback capacitor comprise common switching means coupled between said capacitors and the inverting input of the first amplifier, and said second diagonally-switched capacitor and the second through-switched negative feedback capacitor comprise common switching means coupled between said capacitors and the inverting input of the second amplifier.

4. A switched-capacitor stage as claimed in claim 1, 2, or 3 which comprises switching means, which is common to said first through-switched capacitor and said second diagonally-switched capacitor, coupled between said input and each of said first and second capacitors.

5. A switched capacitor stage comprising first and second signal paths from a single-ended input to a respective one of two differential output terminals, each signal path comprising an amplifier having an inverting input and an output coupled to the respective output terminal, an unswitched capacitor coupled between the inverting input and the output of the amplifier, a feedback capacitor and first and second switching means for selectively and simultaneously connecting the terminals of the feedback capacitor either to the output and inverting input respectively of the amplifier or to a reference potential, a further capacitor having one terminal connected to the junction between the feedback capacitor and the second switching means, and third switching means for connecting the other terminal of the further capacitor selectively to either the input or to the reference potential synchronously with the first and second switching means, the operations of the first and second switching means relative to those of the third switching means of the two signal paths being oppositely phased whereby the further capacitor of the first signal path is through-switched and the further capacitor of the second signal path is diagonally-switched to produce differential output signals from a single-ended input signal.

6. A switched-capacitor stage as claimed in claim 5 wherein the third switching means of the two signal paths is constituted by a single switching means common to the two signal paths.

* * * * *